(12) United States Patent
Mochizuki

(10) Patent No.: US 7,620,089 B2
(45) Date of Patent: Nov. 17, 2009

(54) SURFACE-EMITTING TYPE SEMICONDUCTOR LASER

(75) Inventor: Masamitsu Mochizuki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 42 days.

(21) Appl. No.: 11/758,251

(22) Filed: Jun. 5, 2007

(65) Prior Publication Data

US 2008/0008219 A1 Jan. 10, 2008

(30) Foreign Application Priority Data

Jul. 7, 2006 (JP) ............................. 2006-187898
Mar. 15, 2007 (JP) ............................. 2007-066617

(51) Int. Cl.
*H01S 5/00* (2006.01)
(52) U.S. Cl. .............................. 372/50.124; 372/50.11; 372/50.1; 372/44.01; 372/19
(58) Field of Classification Search ............ 372/50.124, 372/50.11, 50.1, 44.01, 19
See application file for complete search history.

(56) References Cited

U.S. PATENT DOCUMENTS

| | | | | |
|---|---|---|---|---|
| 5,568,499 A | * | 10/1996 | Lear | ......................... 372/45.01 |
| 5,621,750 A | * | 4/1997 | Iwano et al. | .................. 372/96 |
| 6,778,581 B1 | | 8/2004 | Lipson | |
| 6,810,056 B1 | | 10/2004 | Lipson et al. | |
| 2002/0163947 A1 | | 11/2002 | Ostergaard et al. | |
| 2004/0091010 A1 | | 5/2004 | Choquette et al. | |
| 2005/0089075 A1 | * | 4/2005 | Baba et al. | ..................... 372/50 |
| 2006/0093008 A1 | | 5/2006 | Mochizuki | |

FOREIGN PATENT DOCUMENTS

| | | |
|---|---|---|
| EP | 1 528 647 A2 | 5/2005 |
| JP | A 2003-086895 | 3/2003 |
| WO | WO 02/073753 A2 | 9/2002 |

OTHER PUBLICATIONS

Painter et al., "Lithographic Tuning of a Two-Dimensional Photonic Crystal Layer Array", IEEE Photonics Technology Letters, vol. 12, No. 9, September 2000, pp. 1126-1128.

* cited by examiner

*Primary Examiner*—Minsun Harvey
*Assistant Examiner*—Kinam Park
(74) *Attorney, Agent, or Firm*—Oliff & Berridge, PLC

(57) ABSTRACT

A surface-emitting type semiconductor laser includes: a lower mirror; an active layer formed above the lower mirror; and an upper mirror formed above the active layer, wherein the upper mirror includes a first region in which a plurality of holes are formed and a second region inside the first region in which no hole is formed, the second region is in a circular shape as viewed in a plan view, the circular shape has a radius with which an energy increasing rate in the active layer becomes positive with a lower-order mode and (becomes) negative with a higher-order mode, and the holes have a depth with which the energy increasing rate becomes positive with the lower-order mode, and becomes negative with the higher-order mode.

5 Claims, 3 Drawing Sheets

SURFACE-EMITTING TYPE SEMICONDUCTOR LASER

BACKGROUND

1. Technical Field

Several aspects of the present invention relate to surface-emitting type semiconductor lasers.

2. Related Art

As applications of surface-emitting type semiconductor lasers have diversified, and the amount of information in optical communications has expanded in recent years, it is desired further to reduce the number of oscillation modes of surface-emitting type semiconductor lasers while achieving a higher output. For example, in the case of a surface-emitting type semiconductor laser having a selectively oxidized region for optical and current confinement (oxide aperture), the number of oscillation modes may be reduced by reducing the diameter of the oxidized aperture.

It is noted that the output of a semiconductor laser increases with an increase in the injection current, and reaches a maximum value (i.e., a rolloff point) at a certain current. This is because, in a semiconductor laser, its gain spectrum shifts with an increase in the device temperature which is caused by injection current, and the gain reaches a maximum at a certain temperature. When the diameter of the oxide aperture of the surface-emitting type semiconductor laser is relatively small, the temperature of the device would readily elevate, and its rolloff point is reached at a relatively low injection current, such that a sufficient output may not be obtained. In this connection, in an attempt to prevent an increase in the device temperature, Japanese laid-open patent application JP-A-2003-86895 describes a method in which a mesa reaching the lateral current confinement region (hereafter referred as current aperture) is formed, and an electrode is directly formed over the mesa. As a result, the distance between a heat generating section and the electrode is shortened, thereby improving the heat radiation efficiency.

SUMMARY

In accordance with an advantage of some aspects of the present invention, it is possible to provide a surface-emitting type semiconductor laser in which the total number of oscillation modes can be reduced, and a higher output can be achieved, compared to the case where the diameter of the current aperture is simply reduced.

In accordance with an embodiment of the invention, a first surface-emitting type semiconductor laser includes: a lower (bottom) mirror, an active layer formed above the lower mirror, and an upper (top) mirror formed above the active layer, wherein the upper mirror includes a first region in which a plurality of holes are formed and a second region inside the first region in which no hole is formed, the second region is in a circular shape as viewed in a plan view, the circular shape has a radius with which an energy increasing rate of lower-order modes in the active layer is positive and that of higher-order modes is negative, and the holes have a depth with which the energy increasing rate of the lower-order modes is positive and that of the higher-order modes is negative.

By the surface-emitting type semiconductor laser, for example, a single mode or a reduction of higher-order modes can be accomplished irrespective of the diameter of the current aperture. This feature is also confirmed by numerical calculation examples to be described below. As a result, the current level of the rolloff point scarcely changes and a single mode or a reduction of higher-order modes can be achieved while the output of the surface-emitting type semiconductor laser is scarcely reduced. Therefore, in accordance with the present invention, it is possible to provide a surface-emitting type semiconductor laser that can reduce the total number of oscillation modes, and provide a higher output, compared to a case where the diameter of the current aperture is simply reduced.

It is noted that, in descriptions concerning the invention, the term "above" may be used, for example, in a manner as "a specific member (hereafter referred to as 'B') formed 'above' another specific member (hereafter referred to as 'A')." In descriptions concerning the invention, the term "above" is used, in such an exemplary case described above, assuming that the use of the term includes a case in which "B" is formed directly on "A," and a case in which "B" is formed over "A" through another member on "A."

In accordance with an embodiment of the invention, a second surface-emitting type semiconductor laser includes: a lower mirror, an active layer formed above the lower mirror, and an upper mirror formed above the active layer.

wherein the upper mirror includes a first region in which a plurality of holes are formed and a second region inside the first region in which no hole is formed, the second region is in a circular shape as viewed in a plan view, the circular shape has a radius with which a difference in an energy increasing rate between a lower a higher order modes becomes greater than a difference that is obtained without presence of the holes, and the holes have a depth with which a difference in the energy increasing rate becomes greater than a difference that is obtained without the holes.

In the surface-emitting type semiconductor laser in accordance with an aspect of the invention, the circular shape may have a radius with which the difference in the energy increasing rate between a lower and, a higher order modes becomes the maximum, and the holes may have a depth with which the difference in the energy increasing rate between a lower and a higher order modes becomes the maximum.

In the surface-emitting type semiconductor lasers in accordance with an aspect of the invention, the lower-order mode may be a zeroth($0^{th}$)-order mode, and the higher-order mode may be a first and/or higher-order modes.

In the surface-emitting type semiconductor lasers in accordance with an aspect of the invention, the energy increasing rate in the active layer may be obtained by a numerical calculation using a finite-difference time-domain method (FDTD method).

In the surface-emitting type semiconductor lasers in accordance with an aspect of the invention, the energy increasing rate in the active layer may be obtained by a numerical calculation using a two-dimensional finite-difference time-domain method.

DESCRIPTION OF EXEMPLARY EMBODIMENTS

Preferred embodiments of the invention are described below with reference to the accompanying drawings.

1. First, a surface-emitting type semiconductor laser 100 in accordance with an embodiment is described.

Figure 1:
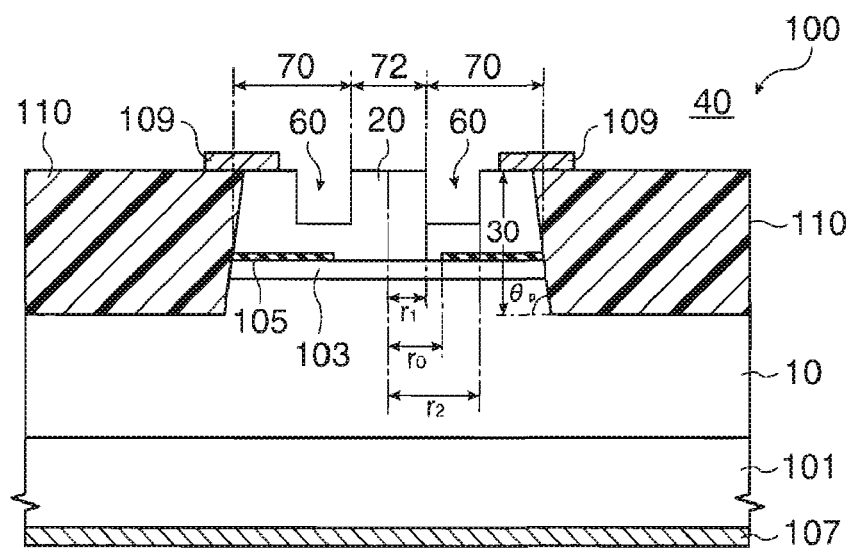
FIG. 1 is a schematic cross-sectional view of a surface-emitting type semiconductor laser in accordance with an embodiment of the invention.
Figure 2:
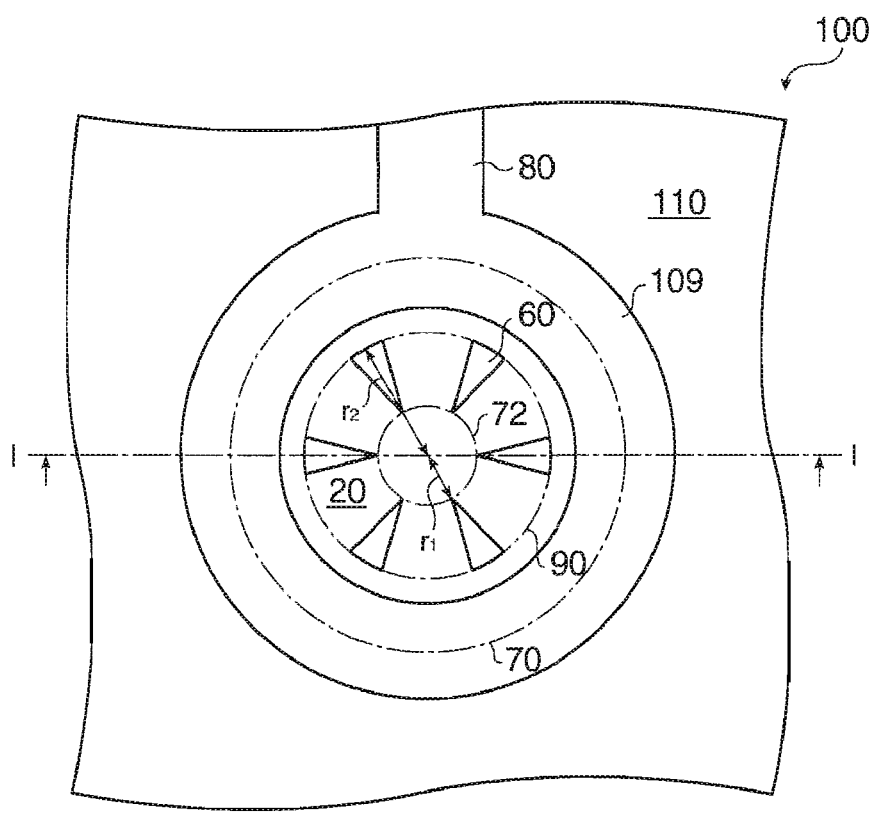
FIG. 2 is a schematic plan view of the surface-emitting type semiconductor laser in accordance with the embodiment of the invention.

FIG. 1 is a schematic cross-sectional view of the surface-emitting type semiconductor laser 100, and FIG. 2 is a schematic cross-sectional view of the surface-emitting type semiconductor laser 100. It is noted that FIG. 1 is a cross-sectional view taken along a line I-I in FIG. 2.

The surface-emitting type semiconductor laser 100 may include, as shown in FIG. 1, a substrate 101, a lower mirror 10, an active layer 103, an upper mirror 20, an insulation layer 110, a first electrode 107 and a second electrode 109.

The substrate 101 may be formed from, for example, a first conductivity type (for example, n-type) GaAs substrate.

The lower mirror layer 10 of, for example, the first conductivity type is formed on the substrate 101. The lower mirror 10 may be a distributed Bragg reflection type (DBR) mirror of alternately laminated lower refractive index layers and higher refractive index layers. The lower refractive index layer may be composed of, for example, an n-type $Al_{0.9}Ga_{0.1}As$ layer (having a refractive index of 3.049). The higher refractive index layer may be composed of, for example, an n-type $Al_{0.15}Ga_{0.85}As$ layer (having a refractive index of 3.525). The lower mirror 10 may be formed by laminating, for example, 37.5 pairs, each pair being composed of the lower refractive index layer and the higher refractive index layer.

The active layer 103 is formed on the lower mirror 10. The active layer 103 has a multiple quantum well (MQW) structure in which quantum well structures each formed from, for example, a GaAs well layer and an $Al_{0.3}Ga_{0.7}As$ barrier layer are laminated in three layers. For example, the active layer 103 may not be doped with an impurity.

The upper mirror layer 20 of, for example, the second conductivity type (for example, p-type) is formed on the active layer 103. The upper mirror 20 may be a distributed Bragg reflection type (DBR) mirror of alternately laminated lower refractive index layers and higher refractive index layers. The lower refractive index layer may be composed of, for example, a p-type $Al_{0.9}Ga_{0.1}As$ layer (having a refractive index of 3.049). The higher refractive index layer may be composed of, for example, a p-type $Al_{0.15}Ga_{0.85}As$ layer (having a refractive index of 3.525). The upper mirror 20 may be formed by laminating, for example, 25 pairs, each being composed of the lower refractive index layer and the higher refractive index layer.

The upper mirror 20 includes a first region 70 in which one or plural holes 60 are formed, and a second region 72 that is provided inside the first region 70 and does not have holes 60 formed therein. The first region 70 is provided outside the second region 72. As shown in FIG. 2, the second region 72 is in a circular shape as viewed in a plan view. The circular shape has a radius $r_1$ with which an energy increasing rate in the active layer 103 that is obtained by a calculation using finite-difference time-domain method (FDTD method) becomes positive with lower-order modes and (becomes) negative with higher-order modes. Also, the circular shape may have a radius $r_1$ with which a difference in the energy increasing rate in the active layer 103 between a lower and a higher order mode that is obtained by a FDTD calculation becomes greater than a difference in the energy increasing rate that is obtained without the holes 60 being provided. These features shall be described in greater detail below. In accordance with the present embodiment, the radius $r_1$ is referred to as the "inside diameter of the holes 60." In a plan view, the center of the second region 72 may coincide or generally coincide with the center of a columnar section 30 or the center of a current aperture 105.

Also, in accordance with the present embodiment, the radius $r_1$ of the circular shape of the second region 72 in a plane configuration may be made smaller than the radius $r_0$ of the opening section of the current aperture 105. By this, as described below in conjunction with numerical calculation examples, by making the holes 60 deeper, the resonance mode determined by the current aperture 105 can be shifted to the light confinement by the holes 60.

The holes 60 may have a depth with which the energy increasing rate in the active layer 103 obtained by a FDTD calculation becomes positive with the lower-order mode, and (becomes) negative with the higher-order mode. Also, the holes 60 may have a depth with which in the active layer 103 obtained by a FDTD method, a difference in the energy increasing rate between a lower and a higher order modes becomes greater than a difference in the energy increasing rate that is obtained without the holes 60 provided. These features shall be described below in greater detail.

The holes 60 are provided in a manner to extend in the thickness direction of the upper mirror 20. The holes 60 are arranged in plurality, for example, rotationally symmetrically at the same pitch. In the illustrated example, the total number of the holes 60 is six, but the number can be increased or reduced depending on the requirements. The holes 60 can be arranged at positions that have 2 or more-fold rotational symmetry with respect to the center of the second region 72 in a plan view. For example, the holes 60 shown in FIG. 2 have 6-fold rotational symmetry. Each of the holes 60 has a plane configuration that is, for example, in a fan shape, as shown in FIG. 2. For example, the fan shaped holes 60 may be provided in a manner that their tips (each being a point at which two linear lines intersect each other) are positioned at an outer periphery of the second region 72. An angle defined by the two linear lines of each of the fan shapes may be, for example, an acute angle (for example, 30 degrees) as shown in FIG. 2. The circular arc of the fan shaped hole 60 may be, for example, a circular arc of a circle 90 (having a radius $r_2$) that is concentric with a circle of the plane configuration of the second region 72. In the present embodiment, the radius $r_2$ is referred to as the "outer diameter of the holes 60." The outer diameter $r_2$ of the holes 60 may be smaller than the radius $r_0$ of the diameter of the current aperture 105, or greater than the radius $r_0$. The holes 60 may also be formed, for example, in a manner to penetrate the upper mirror 20.

The lower mirror 10, the active layer 103 and the upper mirror 20 can form a vertical resonator. It is noted that the composition of each of the layers and the number of the layers composing the lower mirror 10, the active layer 103 and the upper mirror 20 may be appropriately adjusted depending on the requirements. The upper mirror 20, the active layer 103 and a portion of the lower mirror 10 may form a columnar semiconductor laminate (hereafter referred to as a "columnar section") 30. The columnar section 30 has a plane configuration that is, for example, in a circular shape.

Also, as shown in FIG. 1, for example, at least one of the layers composing the upper mirror 20 can be formed as a current aperture 105. The current aperture 105 is formed in a region near the active layer 103. As the current aperture 105, for example, an AlGaAs layer that is oxidized can be used. The current aperture 105 is a insulation layer having an opening section, and is formed in a ring shape.

The first electrode 107 is formed on the back surface (the surface on the opposite side of the lower mirror 10) of the substrate 101. The first electrode 107 is electrically connected to the lower mirror 10 through the substrate 101. The first electrode 107 may be formed, for example, on the top surface of the lower mirror 10.

The second electrode 109 is formed on the upper mirror 20 and the insulation layer 110. The second electrode 109 is electrically connected to the upper mirror 20. The second electrode 109 has a plane configuration that is, for example, a ring shape. The second electrode 109 has an opening section on the columnar section 30. The opening section has a plane configuration that is, for example, a circular shape. The opening section forms a region where the second electrode 109 is not provided on the top surface of the upper mirror 20. Laser light is emitted from at least a portion of this region. The second electrode 109 is connected to, for example, one end of a lead-out line 80. The other end of the lead-out line 80 may be connected to, for example, an electrode pad (not shown).

The insulation layer 110 is formed on the lower mirror 10. The insulation layer 110 is formed in a manner to surround the columnar section 30. The insulation layer 110 can electrically isolate the second electrode 109 from the lower mirror 10.

2. Next, an example of the method for manufacturing the surface-emitting type semiconductor laser 100 in accordance with the embodiment is described with reference to the accompanying drawings.

Figure 3:
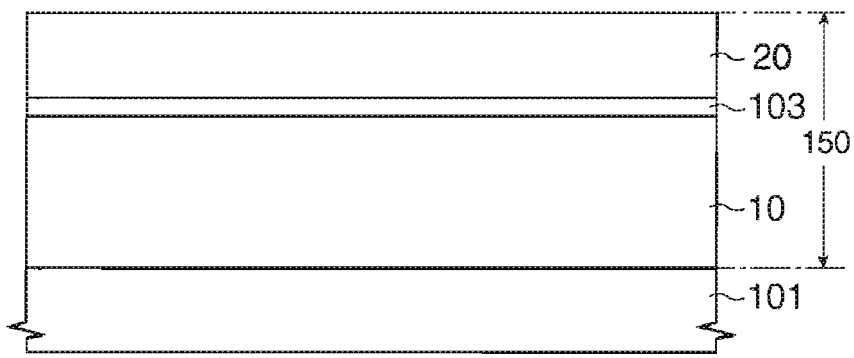
FIG. 3 is a cross-sectional view schematically showing a step of a method for manufacturing a surface-emitting type semiconductor laser in accordance with an embodiment of the invention.
Figure 4:
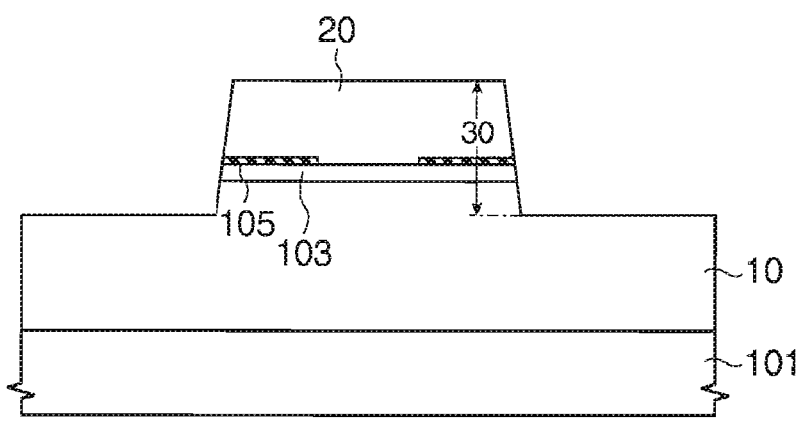
FIG. 4 is a cross-sectional view schematically showing a step of the method for manufacturing a surface-emitting type semiconductor laser in accordance with the embodiment of the invention.

FIG. 3 and FIG. 4 are cross-sectional views schematically showing a manufacturing process for manufacturing the surface-emitting type semiconductor laser 100 in accordance with the present embodiment shown in FIG. 1.

(1) First, as shown in FIG. 3, for example, an n-type GaAs substrate is prepared as a substrate 101. Then, a semiconductor multilayer film 150 is formed on the substrate 101 by epitaxial growth while modifying its composition. The semiconductor multilayer film 150 is formed by successively laminating semiconductor layers that compose a lower mirror 10, an active layer 103 and an upper mirror 20. When the upper mirror 20 is grown, at least one layer thereof near the active layer 103 is formed to be a layer that is later oxidized and becomes a current aperture 105. As the layer that becomes to be the current aperture 105, for example, an AlGaAs layer with its Al composition being 0.95 or greater may be used.

(2) Then, as shown in FIG. 4, the semiconductor multilayer film 150 is patterned, thereby forming a lower mirror 10, an active layer 103, and an upper mirror 20, each in a desired configuration. By this, the columnar section 30 is formed. The semiconductor multilayer film 150 may be patterned by using, for example, lithography technique and etching technique.

Then, by placing the substrate 101 on which the columnar section 30 is formed through the aforementioned steps in a water vapor atmosphere, for example, at about 400° C., the layer that becomes to be the aforementioned current aperture 105 is oxidized from its side surface, thereby forming the oxide current aperture 105.

(3) Next, as shown in FIGS. 1 and 2, an insulation layer 110 is formed on the lower mirror 10 in a manner to surround the columnar section 30. First, an insulation layer composed of polyimide resin or the like is formed over the entire surface by using, for example, a spin coat method. Then, the top surface of the columnar section 30 is exposed by using, for example, a CMP method or the like. Then, the insulation layer is patterned by, for example, lithography technique and etching technique. In this manner, the dielectric layer 110 in a desired configuration can be formed.

(4) Next, as shown in FIG. 1 and FIG. 2, holes 60 are formed in a first region 70 of the upper mirror 20. In this instance, holes 60 are not formed in the second region 72 of the upper mirror 20. The holes 60 may be formed by, for example, photo-lithography or EB(electron beam)-lithography technique and etching technique.

(5) Then, as shown in FIG. 1 and FIG. 2, a first electrode 107 and a second electrode 109 are formed. The electrodes may be formed in desired configurations, respectively, by, for example, a combination of a vacuum vapor deposition method and a lift-off method. It is noted that the order of forming the electrodes is not particularly limited.

(6) By the steps described above, the surface-emitting type semiconductor laser 100 in accordance with the present embodiment is obtained, as shown in FIG. 1 and FIG. 2.

3. Next, numerical calculation examples are described.

Figure 5:
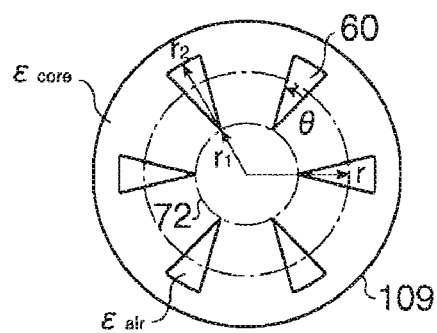
FIG. 5 is a schematic view showing a part of parameters concerning numerical calculation examples.

In the numerical calculation examples, optical simulation on surface-emitting type semiconductor lasers (including examples of the present embodiment and comparison examples) was conducted, using the two-dimensional finite-difference time-domain method (FDTD method). Changes in the refractive index in the circumferential direction are averaged to obtain an average refractive index, using the following formula.

$$\varepsilon(r) = \varepsilon_{core} - \frac{N(\varepsilon_{core} - \varepsilon_{air})}{2\pi}\left\{\theta - 2\sin^{-1}\left(\frac{r_1}{r}\sin\frac{\theta}{2}\right)\right\} \quad \text{[Formula 1]}$$

where $\varepsilon(r)$ is a mean dielectric constant along a circle with a radius r at a distance r ($r_1 < r < r_2$) from the center, $\varepsilon_{core}$ is a dielectric constant at $r < r_1$, $\varepsilon_{air}$ is a dielectric constant of the hole 60 (a dielectric constant of air), N is the number of the holes 60, θ is an angle defined by the two linear lines forming the fan shaped portion, and r is a distance from the center. FIG. 5 schematically shows a part of parameters. As long as using fan shaped holes and rotational arrangement, a mean refractive index can be obtained by using the above-mentioned formula when the number of the holes 60 are changed. A difference in the refractive index caused by a difference in the electric field intensity among oscillation modes of laser light is automatically reflected when calculation by the two dimensional FDTD method is performed (in other words, weighing on the electric field intensity is not necessary for assuming the mean refractive index).

The numerical calculation samples have the following structure.

The substrate 101: an n-type GaAs substrate (with a refractive index of 3.62)

Each pair in the lower mirror 10: a pair of an n-type $Al_{0.9}Ga_{0.1}As$ layer (having a refractive index of 3.049), and an n-type $Al_{0.15}Ga_{0.85}As$ layer (having a refractive index of 3.525) formed thereon.

The thickness of each pair in the lower mirror 10: 129.981 nm

The number of pairs in the lower mirror 10: 37.5 pairs

The active layer 103: a layer having a three-QW structure in which quantum well structures each formed from a GaAs layer (having a refractive index of 3.6201) and an $A_{0.3}Ga_{0.7}As$ layer (having a refractive index of 3.4297) are laminated in three layers The thickness of the active layer 103: 251.195 nm Each pair in the upper mirror 20: a pair of a p-type $Al_{0.9}Ga_{0.1}As$ layer (having a refractive index of 3.049), and a p-type $Al_{0.15}Ga_{0.85}As$ layer (having a refractive index of 3.525) formed thereon.

The thickness of each pair in the upper mirror 20: 129.98 nm

The number of pairs in the upper mirror 20: 25 pairs

The insulation layer 110: a layer of polyimide resin (having a refractive index of 1.78)

The external atmosphere 40 of the surface-emitting type semiconductor laser 100: air (having a refractive index of 1.00)

The inclination angle (the post inclination angle) $\theta_p$ of the columnar section 30: 80 degrees The outer diameter (the post diameter) of the columnar section 30 in a plan view: about 50 μm The number of pairs in the lower mirror 10 in the columnar section 30: 4 pairs The current aperture 105: an AlGaAs layer that is oxidized at the first layer on the active layer 103 (having a refractive index of 1.6)

The thickness of the current aperture 105: 30 nm

The radius roof the current aperture 105: 6.5 μm

The radius of the second region 72 in the upper mirror 20 (the inside diameter of the holes 60) $r_1$: 2.5 μm, 4.0 μm The outside diameter $r_2$ of the holes 60: 9.5 μm An angle defined by the two linear lines of the hole 60 in a plane configuration: 30 degrees The number of the holes 60: 6

Figure 6:
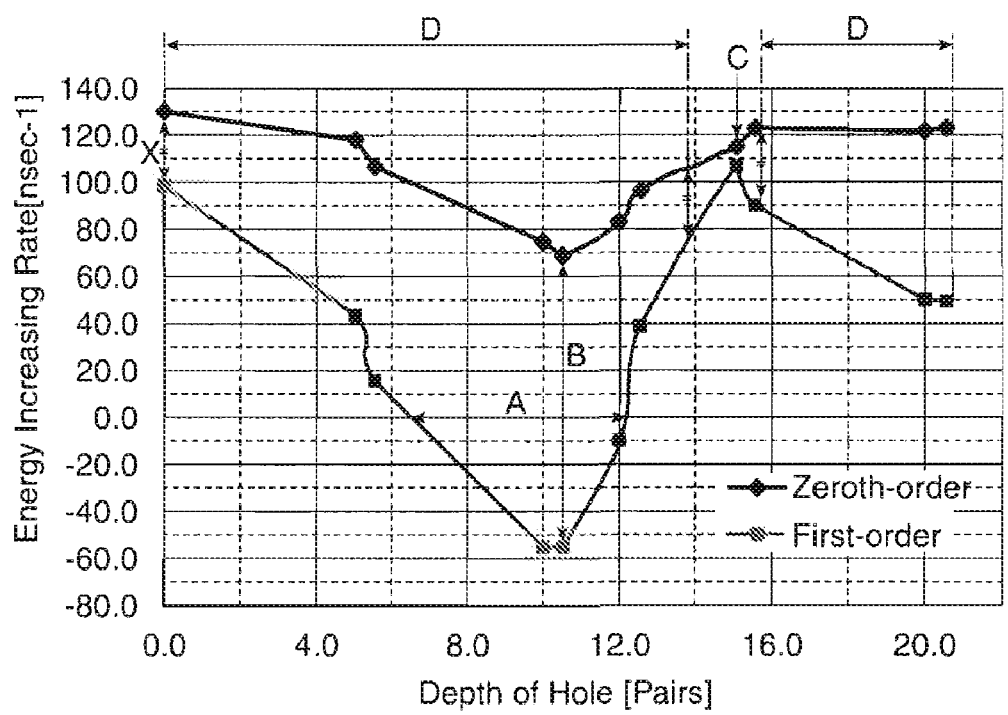
FIG. 6 shows the results of energy increasing rates of different resonance modes concerning numerical calculation examples.
Figure 7:
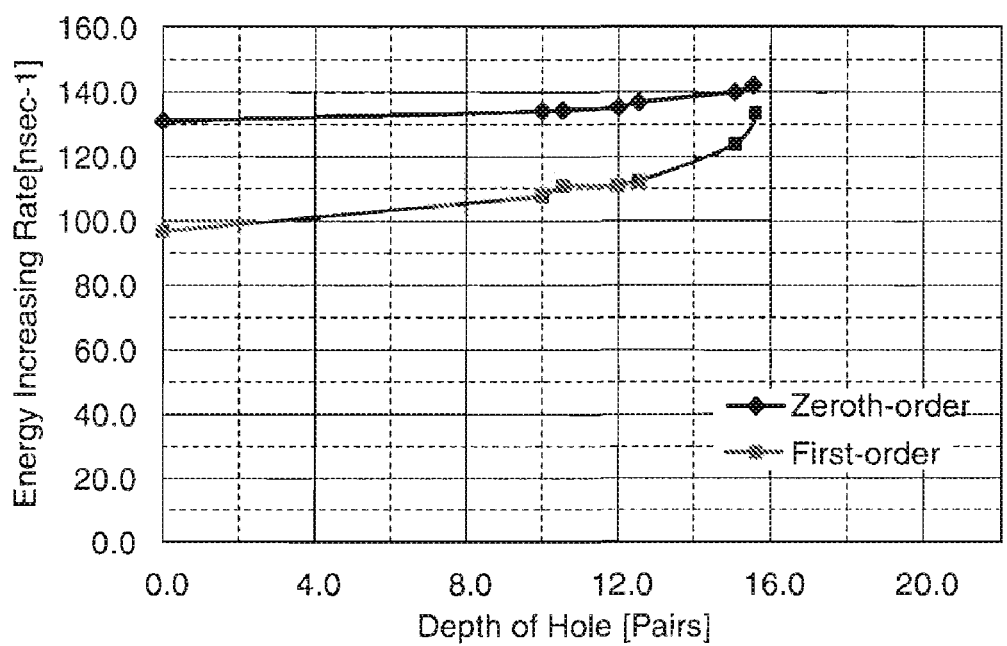
FIG. 7 shows the results of energy increasing rates of different resonance modes concerning numerical calculation examples.

The depth of the holes 60 (in a unit defined by the number of pairs in the upper mirror 20): 0 pair, 5 pairs, 5.5 pairs, 10 pairs, 10.5 pairs, 12 pairs, 12.5 pairs, 15 pairs, 15.5 pairs, 20 pairs, and 20.5 pairs The design wavelength (light wavelength with the maximum intensity among light generated by the surface-emitting type semiconductor laser 100) λ: 850 nm Energy increasing rates of the zeroth($0^{th}$)-order mode and the first($1^{st}$)-order mode in the active layer were calculated for each of the numerical calculation examples, using the two-dimensional FDTD method, and the calculation results are shown in FIG. 6 and FIG. 7. FIG. 6 shows the case where the radius $r_1$ of the second region 72 of the upper mirror 20 is 2.5 μm, and FIG. 7 shows the case where the radius $r_1$ is 4.0 μm. The depth of the holes 60 is plotted along the abscissas axis, and the energy increasing rate in the active layer 103 is plotted along the ordinates axis.

As shown in FIG. 6, it is observed that there exists a range A of depths of the holes 60 in which the energy increasing rate of a lower-order mode (zeroth($0^{th}$)-order transverse mode) is positive, and the energy increasing rate of a higher-order mode (first($1^{st}$) order transverse mode) is negative. In other words, at the depth of the holes 60 in the range A, the first-order mode does not lead to laser oscillation, and only the zeroth($0^{th}$)-order mode leads to laser oscillation. Also, the second or higher order transverse mode does not lead to laser oscillation, like the first order mode. Accordingly, laser light emitted from the surface-emitting type semiconductor laser 100 can be oscillated in a single mode. The range A corresponds to, for example, the depth of the holes 60 at 7 pairs or more but 12 pairs or less.

Also, as shown in FIG. 6, when the depth of the holes 60 is made deeper from zero pair (in other words, in the case where the holes 60 do not exist), the reflection coefficient of the upper mirror 20 lowers, and the energy increasing rate in the active layer 103 decreases in both of the zeroth($0^{th}$)-order mode and the first($1^{st}$)-order mode, As the light of first($1^{st}$)-order mode exists more in a portion away from the center of the second region 72 (compared to zeroth($0^{th}$)-order mode), the first($1^{st}$)-order mode receives a greater influence by the holes 60, and its energy increasing rate in the active layer 103 would more likely decrease by the reflection loss. Therefore, in the energy increasing rate in the active layer 103, the difference in the energy increasing rate between the zeroth ($0^{th}$)-order mode and the first($1^{st}$)-order mode becomes greater. When the depth of the holes 60 corresponds to, for example, 10.5 pairs, the difference in the energy increasing rate reaches its maximum (a difference B in the energy increasing rate indicated in the figure).

When the holes 60 are made even deeper, the energy increasing rate in the active layer 103 increases in both of the zeroth($0^{th}$)-order mode and the first($1^{st}$)-order mode. Here, the energy increasing rate in the active layer 103 would more likely increase in the first($1^{st}$)-order mode. Therefore, the difference in the energy increasing rate between the zeroth ($0^{th}$)-order mode and the first($1^{st}$)-order mode becomes smaller. Then, when the depth of the holes 60 corresponds to, for example, 15 pairs (at a point C in the figure), the difference in the energy increasing rate reaches its minimum. This phenomenon occurs because the resonance mode determined by the current aperture 105 gradually shifts to the light confinement states by the holes, whereby the mode diameter becomes smaller, and the reflection loss caused by the holes 60 on both modes almost disappears.

As the holes 60 are made even deeper, the influence by the holes 60 on the reflection rate of the upper mirror 20 appears even on the mode that has shifted to the light confinement states by the holes 60. In other words, the reflection rate of the upper mirror 20 lowers, such that the energy increasing rate in the active layer 103 in both of the zeroth($0^{th}$) and the first($1^{st}$)-order modes decreases. As, the first-order mode exists more in a portion away from the center of the second region 72 (compared to zeroth($0^{th}$)-order mode), the first($1^{st}$)-order mode receives a greater reflection loss by the holes 60, and its energy increasing rate in the active layer 103 would more likely decrease. Accordingly, in the energy increasing rate in the active layer 103, the difference in the energy increasing rate between the zeroth($0^{th}$) and the first($1^{st}$)-order modes becomes greater.

It is therefore understood from the foregoing results that there exist ranges D of depths of the holes 60 in which the difference in the energy increasing rate between the zeroth ($0^{th}$) and the first($1^{st}$)-order modes becomes greater than an energy increasing rate difference X that is provided in the case where the holes 60 do not exist. In other words, at depths of the holes 60 in the ranges D, the laser intensity of the first ($1^{st}$)-order mode is reduced more than that of the zeroth($0^{th}$)-order mode, compared to the case where the holes 60 do not exist. Also, the intensity of the second or higher order transverse modes is reduced more than the zero-order mode, like the first-order mode. Accordingly, in the surface-emitting type semiconductor laser 100 in which the depth of the holes 60 is in the ranges D, a suppression of high order (the first ($1^{st}$)-order or higher order) modes can be achieved more than a low order (the zeroth($0^{th}$)-order) mode, compared to the case where the holes 60 do not exist. The range D corresponds to the depth of the holes 60 at 0.5 pairs or more but 13.5 pairs or less, and at 16 pairs or more but 20.5 pairs or less, for our calculation example. It is noted that FIG. 6 shows arrows near the depths of the holes 60 at 13.5 pairs and 16 pairs, respectively, for the sake of convenience, which indicates an energy increasing rate difference that is equal to the energy increasing rate difference X that is obtained when the holes 60 do not exist.

Also, as shown in FIG. 7, when the radius $r_1$ of the second region 72 of the upper mirror 20 is large (4.0 μm), a reduction in the reflection rate of the upper mirror 20 caused by the holes 60 is small even when the holes 60 are made deeper, and the energy increasing rate in the active layer 103 increases due to the light confinement effect in the transverse direction by the holes 60. In this instance, a high order (the first-order) mode exists more in a portion away from the center of the second region 72, and therefore receives a greater influence by the holes 60, such that the energy increasing rate in the active layer 103 would likely increase. Therefore, it is understood that the examples shown in FIG. 7 are inadequate for forming a single mode or suppressing (eliminating or reducing) high-order modes.

It is understood from FIG. 6 and FIG. 7 that the holes 60 has a great influence on the reflection rate of the upper mirror 20, and the factors that determine the oscillation mode change depending on the depth of the holes 60. According to the surface-emitting type semiconductor laser 100 in accordance with the present embodiment which is obtained in consideration of these factors, creation of a single mode or suppression of higher modes can be achieved, as described above. It is noted that, if single mode conditions are calculated by merely applying a fiber-mode approximation for oscillation modes of the surface-emitting type semiconductor laser 100 in accordance with the present embodiment, the above-described changes in the light confinement state and the reduction in the reflection rate due to the depth of the holes 60 would not be sufficiently taken into consideration, such that a single mode may not precisely be realized. In particular, when the conditions are calculated assuming the oscillation modes to be as modes of an optical fiber, the deeper the holes 60, the greater the difference in the refractive index between the second region 72 and its outer region becomes, such that the total reflection condition would more readily be satisfied, which is understood to be disadvantageous for creating a single mode. In contrast, according to the present proposed embodiment, by deepening the holes 60, the reflection rate can be intentionally reduced, whereby a single mode can be realized. According to the present proposed embodiment, even when the inside diameter $r_1$ of the holes 60 is made greater than a single mode diameter, suppression of higher-order, modes can be achieved by applying the reflection losses for higher-order modes.

Furthermore, in the numerical calculation examples described above, the simulation is conducted with the zeroth ($0^{th}$)-order mode being used as a lower-order mode and the first($1^{st}$)-order mode being used as a higher-order mode. However, the present embodiments are not limited to these examples. A lower-order mode may be any modes that have a lower order number than that of higher-order modes. Accordingly, for example, as lower-order modes, the second or lower-order modes may be used, and as higher-order modes, the third or higher-order modes may be used.

4. By the surface-emitting type semiconductor laser 100 in accordance with the present embodiment, creation of a single mode, and suppression of higher modes can be achieved irrespective of the thickness or diameter of the current aperture 105, the inclination angle θ and the outer diameter of the post (i.e., the columnar section 30). As a result, the current level that leads to a rolloff point scarcely changes, and realization of a single mode and/or suppression of higher modes can be achieved while the output of the surface-emitting type semiconductor laser 100 is scarcely reduced. Therefore, in accordance with the present embodiments, there is provided a surface-emitting type semiconductor laser that can reduce the total number of oscillation modes and can generate a higher output compared to the case where the diameter of a current aperture is simply reduced.

5. Embodiments of the invention are described above in detail. However, a person having an ordinary skill in the art should readily understand that many modifications can be made without departing in substance from the novel matter and effect of the invention. Accordingly, those modified examples are also deemed included in the scope of the invention.

For example, the surface-emitting type semiconductor laser in accordance with the embodiment of the invention is applicable to, for example, a device having a heatsink structure, a device having a flip chip structure, a device having a protection structure against electrostatic discharge (ESD) destruction, a device having a monitoring photodiode (MPD), a device having an ink jet microlens, a device having a dielectric mirror, an optical module such as an optical sub-assembly (OSA) using a CAN, a ceramic package or the like, an optical transmission apparatus implementing the aforementioned devices, and the like.

Also, for example, when an epitaxial lift-off (ELO) method is used, the substrate 101 in the surface-emitting type semiconductor laser 100 can be separated. In other words, the surface-emitting type semiconductor laser 100 may be provided without the substrate 101.

The entire disclosure of Japanese Patent Application Nos: 2006-187898, filed Jul. 07, 2006 and 2007-06661-7, filed Mar. 15, 2007 are expressly incorporated by reference herein.

What is claimed is:

1. A surface emitting type semiconductor laser, comprising:
 a lower mirror;
 an active layer formed on the lower mirror; and
 an upper mirror having a plurality of pairs of conductive layers formed above the active layer, the upper mirror including a first region, a second region formed inside the first region, and a current aperture, the first region having a first hole portion and a first non-hole portion, the first hole portion having a plurality of holes, the first non-hole portion formed between the first hole portion and the active layer, and having 13 to 18 pairs of the conductive layers, the second region being in a circular shape as viewed in a plan view, the circular shape being formed with a radius where an energy increasing rate in the active layer is positive with respect to a zeroth-order mode and is negative with respect to a first-order mode, the radius of the circular shape being less than 62% of a radius of an opening section of the current aperture.

2. The surface emitting type semiconductor laser according to claim 1, the plurality of holes formed rotationally symmetrically at the same pitch.

3. The surface emitting type semiconductor laser according to claim 1, further comprising:
   an insulating layer formed on a portion of the lower mirror and surrounding a columnar section constituted by the lower mirror, the active layer, and the upper mirror.

4. The surface emitting type semiconductor laser according to claim 1, the upper mirror having 25 pairs of the conductive layers.

5. The surface emitting type semiconductor laser according to claim 1, the radius of the circular shape is in a range of 38-62% of the radius of the opening section of the current aperture.

* * * * *